United States Patent
Yoshida et al.

(10) Patent No.: US 11,758,812 B2
(45) Date of Patent: Sep. 12, 2023

(54) POWER GENERATION ELEMENT, POWER GENERATION MODULE, POWER GENERATION DEVICE, AND POWER GENERATION SYSTEM

(71) Applicant: KABUSHIKI KAISHA TOSHIBA, Tokyo (JP)

(72) Inventors: Hisashi Yoshida, Kawasaki (JP); Shigeya Kimura, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 346 days.

(21) Appl. No.: 17/143,213

(22) Filed: Jan. 7, 2021

(65) Prior Publication Data
US 2021/0313502 A1  Oct. 7, 2021

(30) Foreign Application Priority Data
Apr. 6, 2020 (JP) .................. 2020-068610

(51) Int. Cl.
*H02M 1/15* (2006.01)
*H10N 10/80* (2023.01)
(Continued)

(52) U.S. Cl.
CPC .............. *H10N 10/80* (2023.02); *H02M 1/15* (2013.01); *H02M 7/003* (2013.01); *H02M 1/007* (2021.05)

(58) Field of Classification Search
CPC ........ H10N 10/80; H02M 1/15; H02M 7/003; H02M 1/007
See application file for complete search history.

(56) References Cited

U.S. PATENT DOCUMENTS

| | | | |
|---|---|---|---|
| 6,350,999 B1 * | 2/2002 | Uenoyama .............. | H01J 1/308 257/101 |
| 6,566,692 B2 * | 5/2003 | Uenoyama .............. | H01J 1/308 257/256 |

(Continued)

FOREIGN PATENT DOCUMENTS

| | | |
|---|---|---|
| JP | 2000-323015 A | 11/2000 |
| JP | 2002-057322 A | 2/2002 |

(Continued)

*Primary Examiner* — S M Sohel Imtiaz
(74) *Attorney, Agent, or Firm* — Oblon, McClelland, Maier & Neustadt, L.L.P.

(57) ABSTRACT

A power generation element includes a first crystal region including $Al_{x1}Ga_{1-x1}N$ ($0<x1\leq1$), and a second crystal region including a first element and $Al_{x2}Ga_{1-x2}N$ ($0\leq x2<x1$). The first element includes at least one selected from the group consisting of Si, Ge, Te, and Sn. The first crystal region includes a first surface and a second surface. The second surface is between the second crystal region and the first surface. The second crystal region includes a third surface and a fourth surface. The third surface is between the fourth surface and the first crystal region. An orientation from the fourth surface toward the third surface is along a <0001> direction of the second crystal region. An orientation from the second surface toward the first surface is along a <000-1> direction of the first crystal region.

20 Claims, 8 Drawing Sheets

(51) Int. Cl.
    *H02M 7/00*      (2006.01)
    *H02M 1/00*      (2006.01)

(56)     References Cited

U.S. PATENT DOCUMENTS

| | | | | |
|---|---|---|---|---|
| 2013/0032190 A1* | 2/2013 | Hwang | ............... | H10N 10/852 |
| | | | | 136/238 |
| 2013/0146114 A1* | 6/2013 | Jang | ...................... | H10N 10/17 |
| | | | | 136/200 |
| 2014/0027714 A1* | 1/2014 | Delprat | ................. | H10N 10/01 |
| | | | | 257/14 |
| 2015/0140710 A1* | 5/2015 | McLaurin | ........... | H01S 5/32025 |
| | | | | 438/33 |
| 2015/0303363 A1* | 10/2015 | Kirihara | ................. | H10N 10/80 |
| | | | | 136/201 |
| 2015/0325768 A1* | 11/2015 | Sakai | ................... | H10N 10/853 |
| | | | | 136/211 |
| 2016/0172449 A1* | 6/2016 | Suzuki | ............... | H01L 29/1602 |
| | | | | 257/77 |
| 2018/0337317 A1* | 11/2018 | Kimura | ............... | H02N 11/002 |
| 2018/0351038 A1* | 12/2018 | Watanabe | ............. | C30B 29/406 |
| 2020/0227614 A1* | 7/2020 | Boyd | ..................... | H10N 10/80 |

FOREIGN PATENT DOCUMENTS

| | | |
|---|---|---|
| JP | 2017-101164 A | 6/2017 |
| JP | 2018-195790 A | 12/2018 |
| JP | 2019-071066 A | 5/2019 |

\* cited by examiner

POWER GENERATION ELEMENT, POWER GENERATION MODULE, POWER GENERATION DEVICE, AND POWER GENERATION SYSTEM

CROSS-REFERENCE TO RELATED APPLICATIONS

This application is based upon and claims the benefit of priority from Japanese Patent Application No. 2020-068610, filed on Apr. 6, 2020; the entire contents of which are incorporated herein by reference.

FIELD

Embodiments of the invention generally relate to a power generation element, a power generation module, a power generation device, and a power generation system.

BACKGROUND

For example, there is a power generation element that generates power in response to heat from a heat source. It is desirable to stably increase the efficiency of the power generation element.

DETAILED DESCRIPTION

Figure 1:
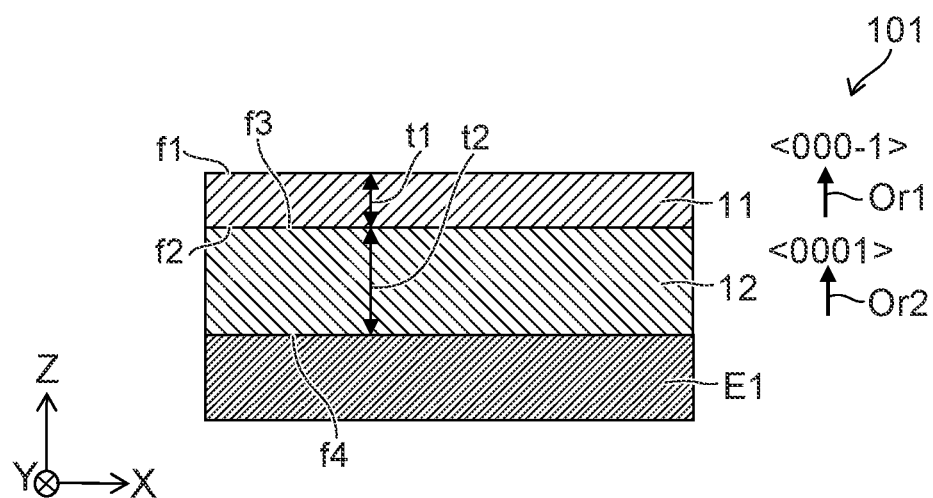
FIG. 1 is a schematic cross-sectional view illustrating a power generation element according to a first embodiment.

According to one embodiment, a power generation element includes a first crystal region including $Al_{x1}Ga_{1-x1}N$ ($0<x1\leq1$), and a second crystal region including a first element and $Al_{x2}Ga_{1-x2}N$ ($0\leq x2<x1$). The first element includes at least one selected from the group consisting of Si, Ge, Te, and Sn. The first crystal region includes a first surface and a second surface. The second surface is between the second crystal region and the first surface. The second crystal region includes a third surface and a fourth surface. The third surface is between the fourth surface and the first crystal region. An orientation from the fourth surface toward the third surface is along a <0001> direction of the second crystal region. An orientation from the second surface toward the first surface is along a <000-1> direction of the first crystal region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a power generation element according to a first embodiment.

As shown in FIG. 1, the power generation element 101 according to the embodiment includes a first crystal region 11 and a second crystal region 12.

The first crystal region 11 includes $Al_{x1}Ga_{1-x1}N$ ($0<x1\leq1$). The composition ratio x1 is, for example, not less than 0.75. In one example, the first crystal region 11 is an AlN layer. The first crystal region 11 is polarized.

The second crystal region 12 includes $Al_{x2}Ga_{1-x2}N$ ($0\leq x2<x1$). The composition ratio x2 is, for example, less than 0.75. In one example, the second crystal region 12 is a GaN layer. The second crystal region 12 includes a first element including at least one selected from the group consisting of Si, Ge, Te, and Sn. The first element is an n-type impurity. The second crystal region 12 is, for example, an n-type GaN layer.

In the example, the power generation element 101 includes a first electrode E1. The second crystal region 12 is between the first electrode E1 and the first crystal region 11. The first electrode E1 and the second crystal region 12 are electrically connected.

The first crystal region 11 includes a first surface f1 and a second surface f2. The second surface f2 is between the second crystal region 12 and the first surface f1. For example, the second surface f2 is the lower surface, and the first surface f1 is the upper surface.

The second crystal region 12 includes a third surface f3 and a fourth surface f4. The third surface f3 is between the fourth surface f4 and the first crystal region 11. For example, the fourth surface f4 is the lower surface, and the third surface f3 is the upper surface.

The direction from the second crystal region 12 toward the first crystal region 11 is taken as a Z-axis direction. The Z-axis direction corresponds to the stacking direction. One direction perpendicular to the Z-axis direction is taken as an X-axis direction. A direction perpendicular to the Z-axis direction and the X-axis direction is taken as a Y-axis direction. For example, the first to fourth surfaces f1 to f4 are along the X-Y plane.

An orientation Or2 from the fourth surface f4 toward the third surface f3 is along the <0001> direction of the second crystal region 12. The <0001> direction is, for example, the +c direction. The second crystal region 12 has a Group III surface (e.g., a Ga-surface). For example, the second crystal region 12 is Group III-polar (e.g., Ga-polar).

An orientation Or from the second surface f2 toward the first surface f1 is along the <000-1> direction of the first crystal region 11. In the notation of the crystal orientations in this specification, "−" corresponds to a bar of the numeral following the "−". The <000-1> direction is, for example, the −c direction. The first surface f1 of the first crystal region 11 has a Group IV surface (e.g., an N-surface). For example, the first crystal region 11 is Group IV-polar (e.g., N-polar).

For example, the third surface f3 is the (0001) plane of the second crystal region 12. For example, the first surface f1 is the (000-1) plane of the first crystal region 11.

For example, such a second crystal region 12 and such a first crystal region 11 are obtained by forming surface layers by adsorbing carbon and/or oxygen as impurities and subsequently performing crystal growth. For example, such a second crystal region 12 and such a first crystal region 11 are obtained by controlling the polarities by using molecular beam epitaxy, which is a nonequilibrium crystal growth technique.

For example, the first surface f1 is the N-surface of a nitride semiconductor having a high Al composition ratio. Electrons are easily emitted from such a first surface f1. For example, electrons are supplied from the first electrode E1 to the second crystal region 12, and the electrons are efficiently emitted from the first surface f1 of the first crystal region 11.

As described below, the efficiency of emitting electrons is low from the surface of a nitride semiconductor (e.g., GaN) having a low Al composition ratio. The efficiency of emitting electrons is high from the surface of a nitride semiconductor (e.g., AlN) having a high Al composition ratio.

For example, to supply electrons from the first electrode E1 to be emitted from a nitride semiconductor (e.g., AlN) having a high Al composition ratio, it is favorable for the conductivity to be high for the nitride semiconductor having the high Al composition ratio. However, it is difficult to practically increase the carrier concentration in the nitride semiconductor having the high Al composition ratio. For example, it is difficult to obtain a high conductivity in a nitride semiconductor having an Al composition ratio not less than 0.75.

In the embodiment, the second crystal region 12 is an n-type nitride semiconductor having a low Al composition ratio. The electrons are supplied to the first crystal region 11 via the second crystal region 12, and the electrons are efficiently emitted from the first surface f1 of the first crystal region 11. Highly efficient power generation is possible.

For example, a thickness t1 of the first crystal region 11 (referring to FIG. 1) is less than a thickness t2 of the second crystal region 12 (referring to FIG. 1). The electrons can efficiently move from the second surface f2 to the first surface f1.

The thickness t1 of the first crystal region 11 is not more than 40 nm. Thereby, the electrons can efficiently move through the first crystal region 11. The thickness t2 of the second crystal region 12 is, for example, not less than 0.1 μm and not more than 10 μm. The thickness t1 and the thickness t2 are lengths along the Z-axis direction.

For example, the first crystal region 11 may be an intrinsic semiconductor of AlN (i-AlN). For example, the carrier concentration in the first crystal region 11 is not more than $2 \times 10^{16}$ cm$^{-3}$. For example, the concentration of the first element in the first crystal region 11 is not more than $2 \times 10^{18}$ cm$^{-3}$. Such a first crystal region 11 can be manufactured with good productivity.

Figure 2:
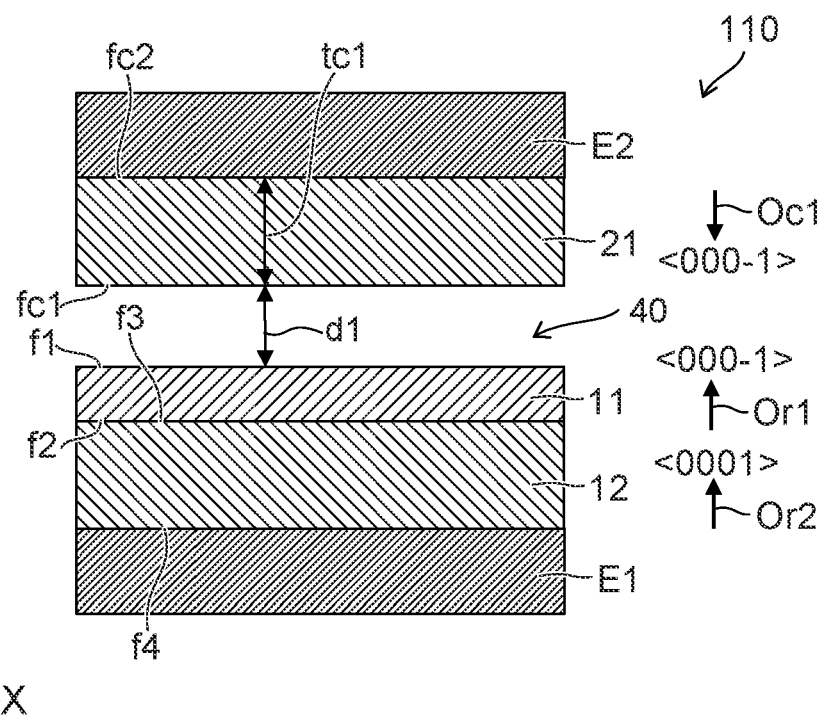
FIG. 2 is a schematic cross-sectional view illustrating the power generation element according to the first embodiment.

FIG. 2 is a schematic cross-sectional view illustrating the power generation element according to the first embodiment.

As shown in FIG. 2, in addition to the first and second crystal regions 11 and 12, the power generation element 110 according to the embodiment further includes a counter conductive region 21. In the example, the power generation element 110 includes a second electrode E2.

The first crystal region 11 is between the second crystal region 12 and the counter conductive region 21. A gap 40 is provided between the first crystal region 11 and the counter conductive region 21. The electrons are efficiently emitted from the first surface f1 toward the counter conductive region 21.

The counter conductive region 21 includes, for example, the first element (the n-type impurity) described above and includes $Al_{z1}Ga_{1-z1}N$ ($0 \leq z1 < 1$ and $z1 < x1$). The composition ratio z1 is, for example, less than 0.75. The counter conductive region 21 is an n-type GaN layer.

For example, the counter conductive region 21 includes a first counter surface fc1 and a second counter surface fc2. The first counter surface fc1 is between the first crystal region 11 and the second counter surface fc2. For example, an orientation Oc1 from the second counter surface fc2 toward the first counter surface fc1 is along the <000-1> direction of the counter conductive region 21. For example, the first counter surface fc1 is along the (000-1) plane of the counter conductive region 21. The first counter surface fc1 is, for example, an N-surface of the counter conductive region 21. The electrons can be efficiently emitted toward such a first counter surface fc1 from the first surface f1 described above.

As shown in FIG. 2, the second crystal region 12 is between the first electrode E1 and the second electrode E2. The first crystal region 11 is between the second crystal region 12 and the second electrode E2. The counter conductive region 21 is between the first crystal region 11 and the second electrode E2. The first electrode E1 is electrically connected to the second crystal region 12. The second electrode E2 is electrically connected to the counter conductive region 21.

A thickness tc1 of the counter conductive region 21 is, for example, not less than 0.1 μm and not more than 10 μm. The thickness tc1 is the length along the Z-axis direction. A distance d1 between the first surface f1 and the first counter surface fc1 is, for example, not less than 0.1 μm and not more than 50 μm. The distance d1 is the length along the Z-axis direction. The distance d1 corresponds to the length along the Z-axis direction of the gap 40.

Figure 3:
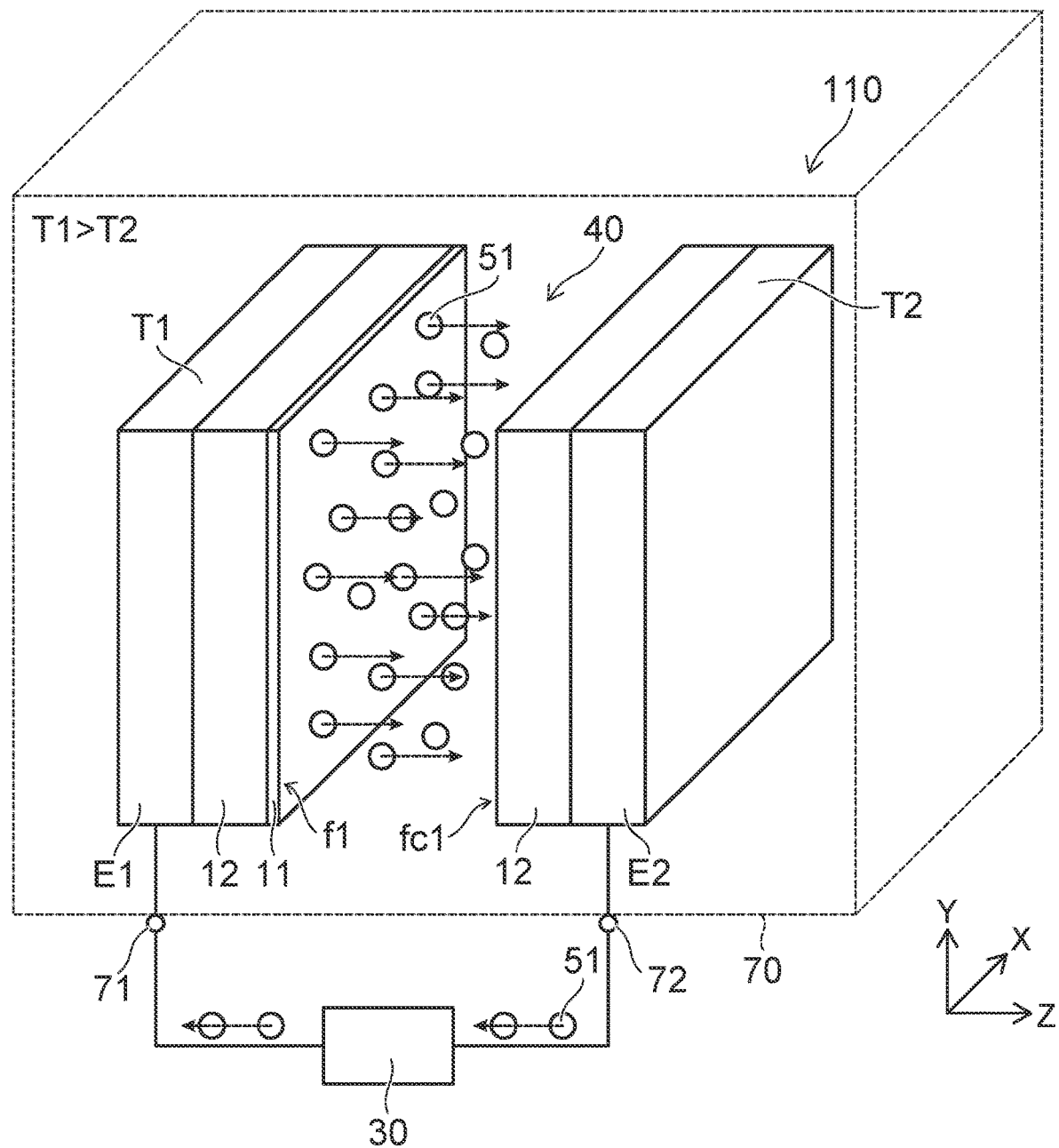
FIG. 3 is a schematic perspective view illustrating the power generation element according to the first embodiment.

FIG. 3 is a schematic perspective view illustrating the power generation element according to the first embodiment.

For example, a container 70 is provided as shown in FIG. 3. The first electrode E1, the second crystal region 12, the first crystal region 11, the counter conductive region 21, and the second electrode E2 are provided inside the container 70. The interior of the container 70 is in a reduced-pressure state. The gap 40 is set to a reduced-pressure state thereby.

For example, a first terminal 71 and a second terminal 72 are provided. The first terminal 71 is electrically connected to the first electrode E1. The second terminal 72 is electrically connected to the second electrode E2. A load 30 can be electrically connected between the first terminal 71 and the second terminal 72.

The load 30 is electrically connected to the first electrode E1 by first wiring 71a. In the example, the connection is performed via the first terminal 71. The load 30 is electrically connected to the second electrode E2 by second wiring 72a. In the example, the connection is performed via the second terminal 72. The power generation element 110 may include the container 70, the first terminal 71, and the second terminal 72. The power generation element 110 may include the first wiring 71a and the second wiring 72a.

The temperature of the first crystal region 11 may be considered to be substantially equal to the temperature of the first electrode E1 due to thermal conduction. The temperature of the counter conductive region 21 may be considered to be substantially equal to the temperature of the second electrode E2 due to thermal conduction.

The temperature of the first electrode E1 and the temperature of the first crystal region 11 are taken as a first temperature T1. The temperature of the second electrode E2 and the temperature of the counter conductive region 21 are taken as a second temperature T2. In one example, the first temperature T1 is set to be greater than the second temperature T2. For example, such a temperature difference can be provided by causing the first electrode E1 to contact or approach a heat source.

In the embodiment, a current I1 flows in the first wiring 71a from the first electrode E1 toward the load 30 when such a temperature difference is provided. The current I1 flows in the second wiring 72a from the load 30 toward the second electrode E2. The current I1 is electrical power obtained from the power generation element 110.

It is considered that the current I1 is based on the movement of electrons 51. For example, the electrons 51 are emitted from the first crystal region 11 toward the gap 40. The electrons 51 that move through the gap 40 reach the counter conductive region 21. The electrons 51 flow to the second electrode E2 via the counter conductive region 21 and reach the load 30 via the second wiring 72a. The electrons 51 flow to the first electrode E1 via the first wiring 71a. A current flows in the load 30 when the temperature of the first terminal 71 is greater than the temperature of the second terminal 72. The temperature difference is converted into the current (the movement of electrons).

An example of simulation results of characteristics of the power generation element will now be described.

FIGS. 4A to 4C and FIGS. 5A to 5C are graphs illustrating characteristics of the power generation element.

These figures show conduction band energies of models of the power generation element having various configurations. The physical property values of Mo are applied as the first electrode E1 and the second electrode E2 in first to sixth models MD1 to MD6. The counter conductive region 21 is an n-type GaN layer in the first to sixth models MD1 to MD6. The first counter surface fc1 is an N-surface.

The second crystal region 12 is an n-type GaN layer in the first to third models MD1 to MD3. The third surface f3 is a Ga-surface. The second crystal region 12 is Ga-polar. The first crystal region 11 is an i-AlN layer in the first to third models MD1 to MD3. The carrier concentration in the i-AlN layer is not more than $2 \times 10^{16}$ cm$^{-3}$. The first surface f1 of the first crystal region 11 is an N-surface. The first crystal region 11 is N-polar. The thickness t1 of the first crystal region 11 is 10 nm in the first model MD1. The thickness t1 of the first crystal region 11 is 20 nm in the second model MD2. The thickness t1 of the first crystal region 11 is 40 nm in the third model MD3.

In the fourth and fifth models MD4 and MD5, the first crystal region 11 is not provided, and the second crystal region 12 is an n-type GaN layer. The third surface f3 is a Ga-surface in the fourth model MD4. The third surface f3 is an N-surface in the fifth model MD5.

In the sixth model MD6, the second crystal region 12 is an n-type GaN layer, and the third surface f3 is a Ga-surface. In the sixth model MD6, the first crystal region 11 is an i-AlN layer, and the first surface f1 is an Al-surface. The thickness t1 of the first crystal region 11 is 20 nm.

In FIGS. 4A to 4C and FIGS. 5A to 5C, the horizontal axis is a position pZ along the Z-axis direction. The vertical axis is an energy Eg. In the examples of FIGS. 4A to 4C and FIGS. 5A to 5C, the temperature of the first electrode E1 is 800 K, and the temperature of the second electrode E2 is 300 K.

Figure 5A:
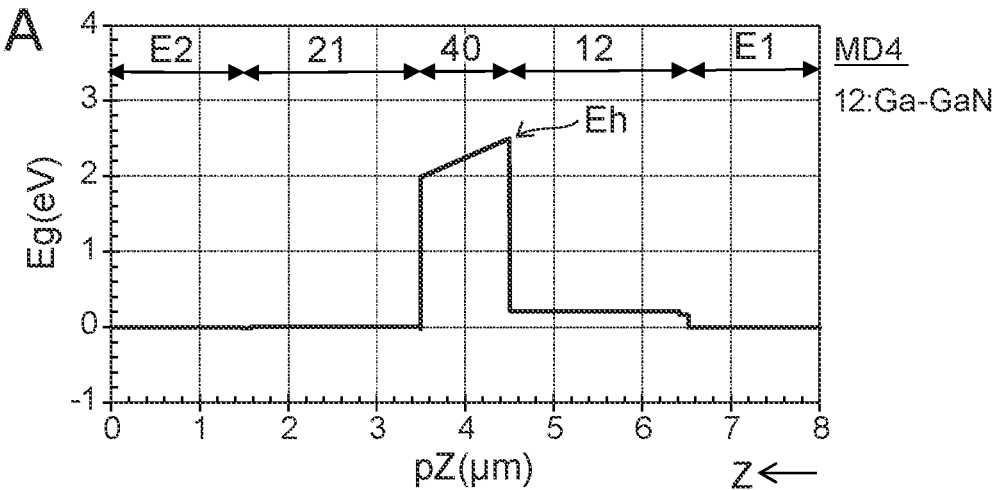
FIGS. 5A to 5C are graphs illustrating characteristics of the power generation element.
Figure 5B:
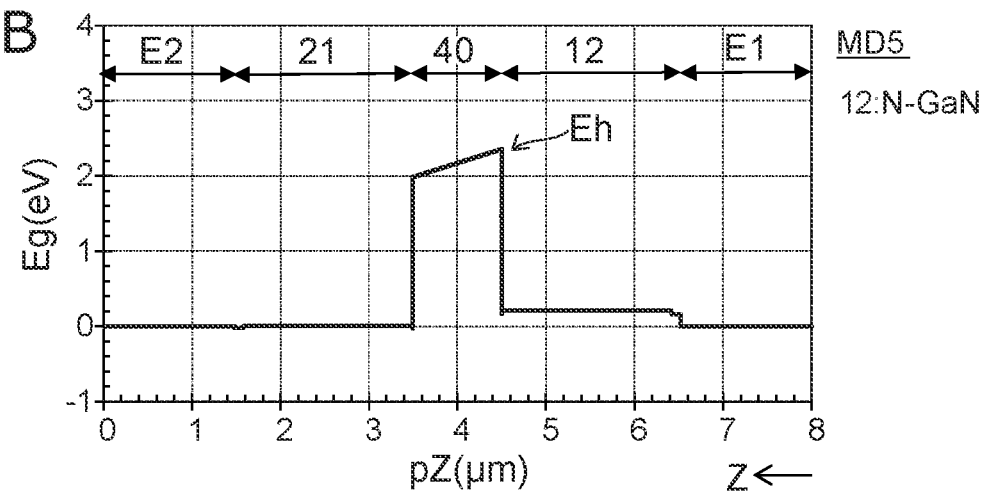
Figure 5C:
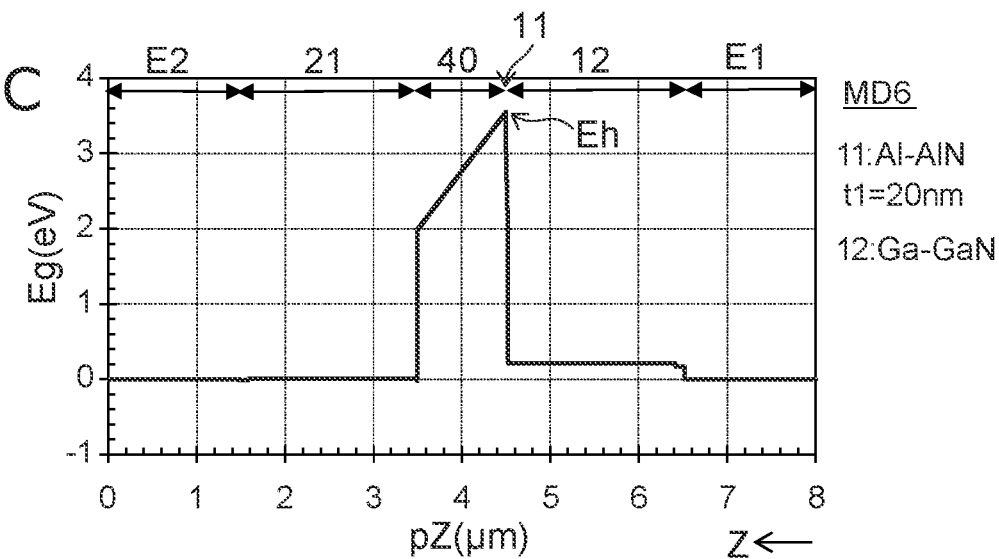

In the fourth and fifth models MD4 and MD5 as shown in FIGS. 5A and 5B, an energy difference Eh at a position corresponding to the front surface of the second crystal region 12 (the surface facing the gap 40) is large and is 2.5 eV or 2.3 eV. In the sixth model MD6 as shown in FIG. 5C, the energy difference Eh at a position corresponding to the front surface of the first crystal region 11 (the surface facing the gap 40) is large and is 3.6 eV. In the fourth to sixth models MD4 to MD6, it is difficult to efficiently emit the electrons 51 into the gap 40.

Figure 4A:
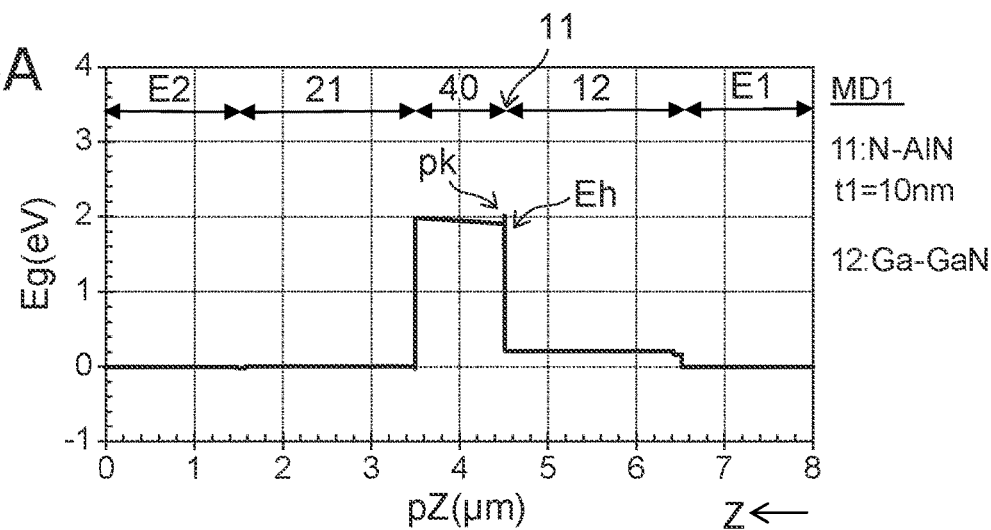
FIGS. 4A to 4C are graphs illustrating characteristics of the power generation element.
Figure 4B:
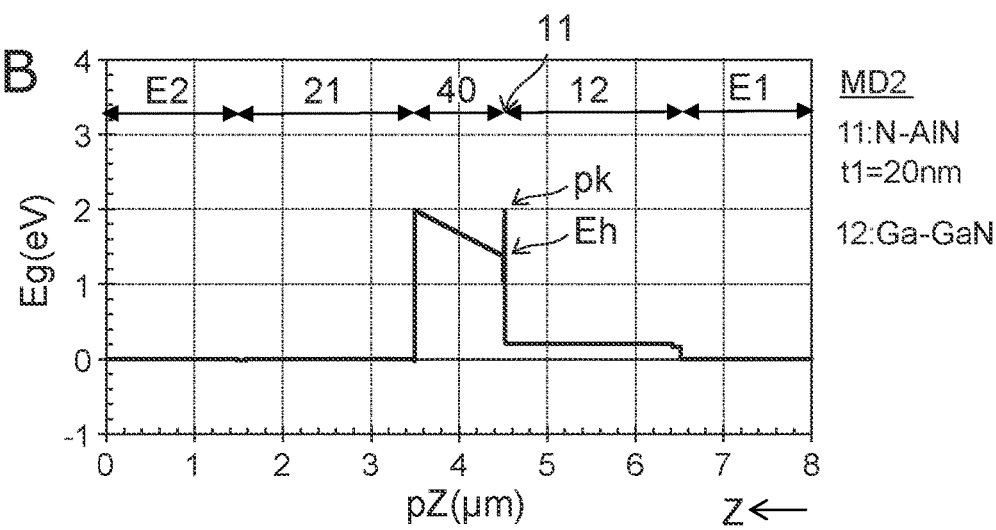
Figure 4C:
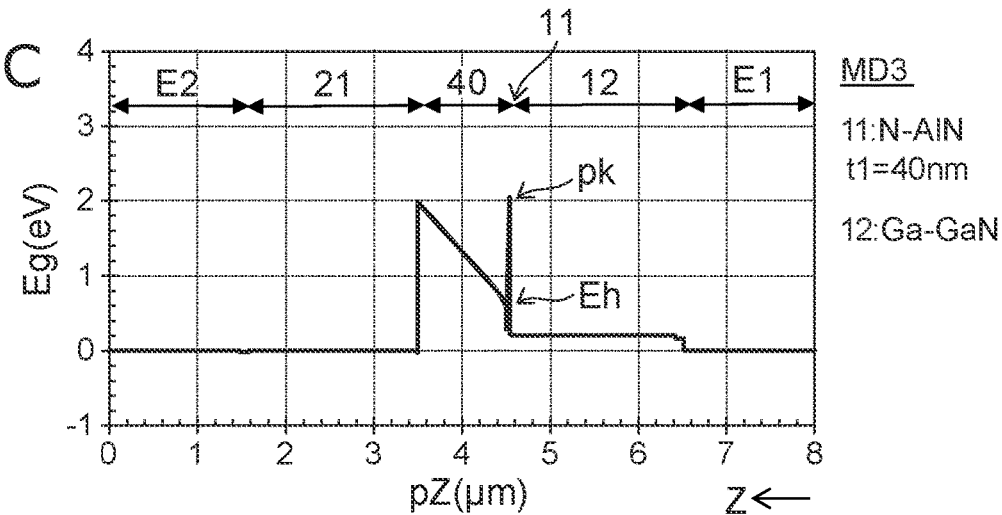

In the first to third models MD1 to MD3 as shown in FIGS. 4A to 4C, sharp peaks pk are observed at the position corresponding to the front surface of the first crystal region 11 (the surface facing the gap 40). Because the width (the length along the Z-axis direction) of the peak pk is narrow, the electrons 51 easily tunnel through the peak pk and are emitted. In the first to third models MD1 to MD3, the energy difference Eh excluding the sharp peak pk substantially relates to the ease of emitting the electrons 51. In the first to third models MD1 to MD3, the energy difference Eh is not more than 2.0 eV. The energy difference Eh of the first model MD1 is 1.9 eV. The energy difference Eh of the second model MD2 is 1.4 eV. The energy difference Eh of the third model MD3 is 0.6 eV. In the first to third models MD1 to MD3, the electrons 51 can be efficiently emitted. A highly efficient power generation is obtained. The energy difference Eh decreases as the thickness t1 increases.

Figure 6A:
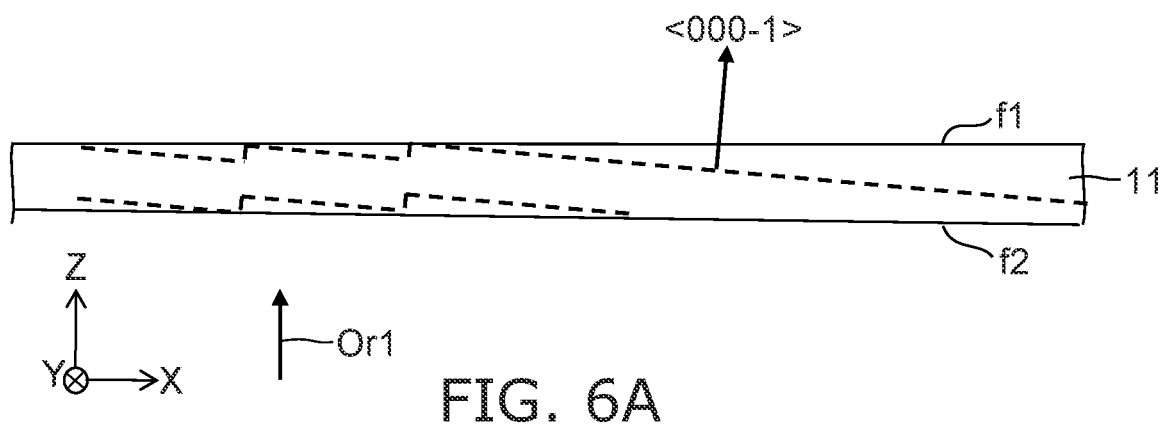
FIGS. 6A and 6B are schematic cross-sectional views illustrating the power generation element according to the first embodiment.
Figure 6B:
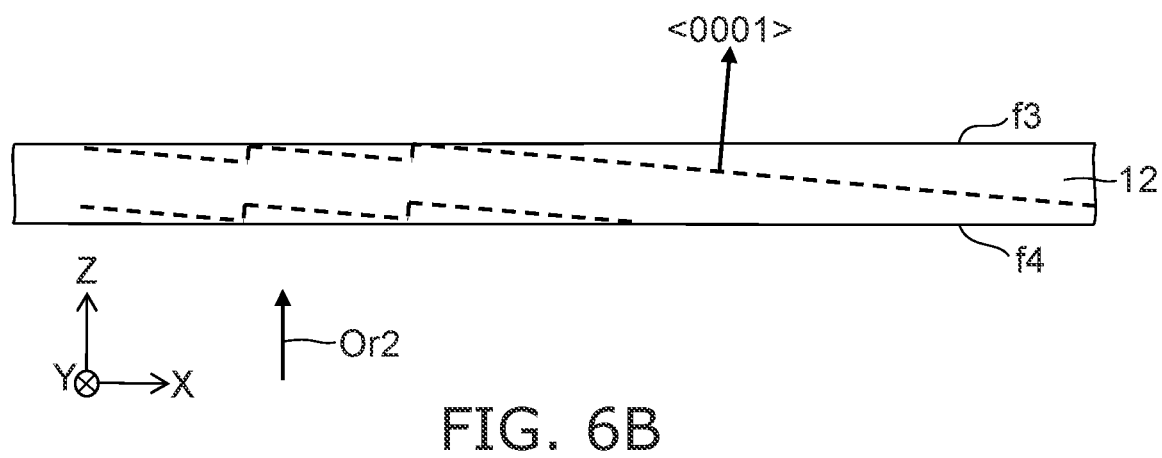

FIGS. 6A and 6B are schematic cross-sectional views illustrating the power generation element according to the first embodiment.

As shown in FIG. 6A, the orientation Or from the second surface f2 toward the first surface f1 may be oblique to the <000-1> direction. The angle between the orientation Or and the <000-1> direction is, for example, not less than 0 degrees and not more than 10 degrees.

As shown in FIG. 6B, the orientation Or2 from the fourth surface f4 toward the third surface f3 may be oblique to the <0001> direction. The angle between the orientation Or2 and the <0001> direction is, for example, not less than 0 degrees and not more than 10 degrees.

In the embodiment, at least one selected from the group consisting of Li, Na, K, Rb, Cs, Fr, Be, Mg, Ca, Sr, Ba, and Ra may exist at the first surface f1 of the first crystal region 11. For example, these elements adsorb to the first surface f1. For example, the first surface f1 of the first crystal region 11 includes at least one selected from the group consisting of Li, Na, K, Rb, Cs, Fr, Be, Mg, Ca, Sr, Ba, and Ra. Thereby, the electrons 51 are more efficiently emitted from the first crystal region 11.

Figure 7:
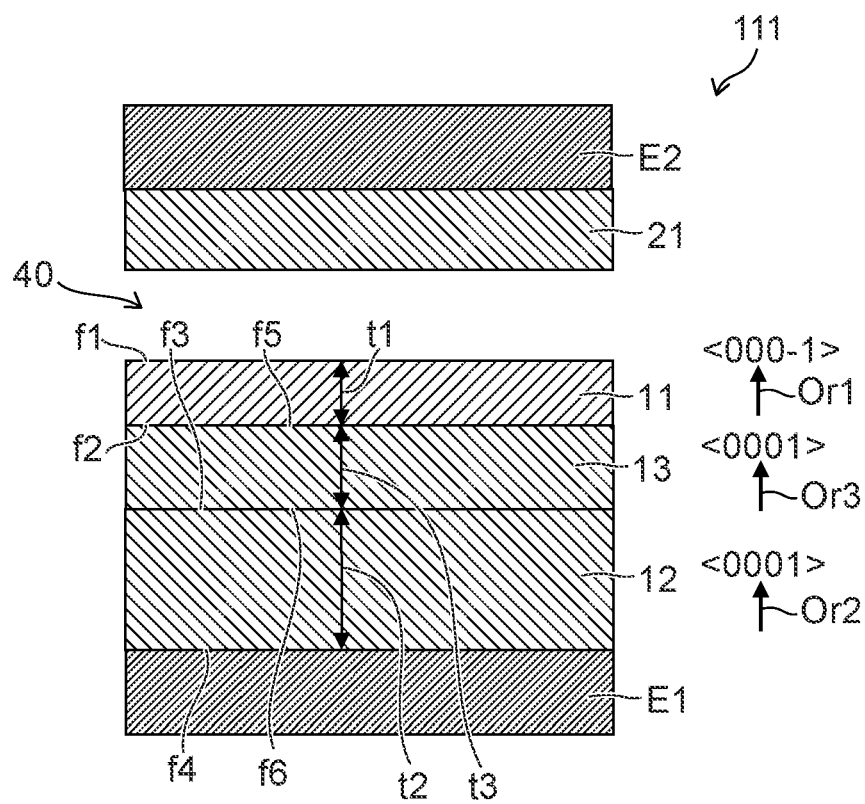
FIG. 7 is a schematic cross-sectional view illustrating a power generation element according to the first embodiment.

FIG. 7 is a schematic cross-sectional view illustrating a power generation element according to the first embodiment.

As shown in FIG. 7, in addition to the first and second crystal regions 11 and 12, the power generation element 111 according to the embodiment further includes a third crystal region 13. The third crystal region 13 is between the second crystal region 12 and the first crystal region 11. The third crystal region 13 includes $Al_{x3}Ga_{1-x3}N$ (x2<x3≤1). For example, the composition ratio x3 is not less than 0.75, and the third crystal region 13 is, for example, an AlN layer. The third crystal region 13 may be an i-AlN layer. For example, the third crystal region 13 includes a fifth surface f5 and a sixth surface f6. The fifth surface f5 is between the sixth surface f6 and the first crystal region 11.

An orientation Or3 from the sixth surface f6 toward the fifth surface f5 is along the <0001> direction of the third crystal region 13. For example, the fifth surface f5 may be the (0001) plane of the third crystal region 13.

The polarity of the crystal inverts between the third crystal region 13 and the first crystal region 11. For example, such second, third, and first crystal regions 12, 13, and 11 are obtained by forming surface layers by adsorbing carbon and/or oxygen as impurities and subsequently performing crystal growth. For example, such second, third, and first crystal regions 12, 13, and 11 are obtained by controlling the polarities by using molecular beam epitaxy, which is a nonequilibrium crystal growth technique.

The concentration of the first element (the n-type impurity) in the third crystal region 13 is not more than $2 \times 10^{18}$ cm$^{-3}$. A thickness t3 of the third crystal region 13 is not more than 10 nm. The thickness t3 of the third crystal region 13 may be, for example, not less than 0.1 nm.

Figure 8:
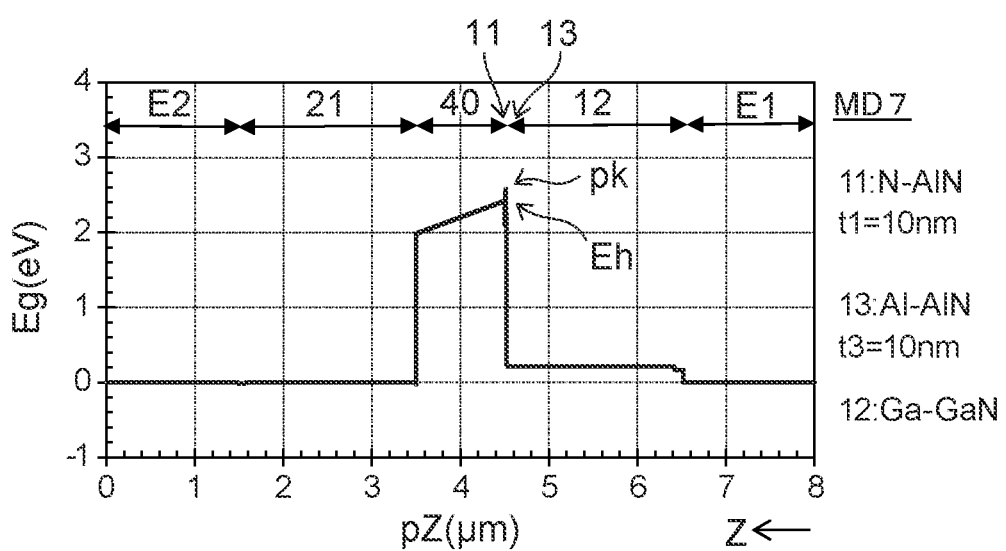
FIG. 8 is a graph illustrating a characteristic of the power generation element.

FIG. 8 is a graph illustrating a characteristic of the power generation element.

FIG. 8 shows the energy of the conduction band in one model of the power generation element. The physical property values of Mo are applied as the first electrode E1 and the second electrode E2 in the seventh model MD7. In the seventh model MD7, the counter conductive region 21 is an n-type GaN layer. The first counter surface fc1 is an N-surface.

In the seventh model MD7, the second crystal region 12 is an n-type GaN layer. The third surface f3 is a Ga-surface. The second crystal region 12 is Ga-polar. In the seventh model MD7, the third crystal region 13 is an i-AlN layer. The fifth surface f5 is an Al-surface. The third crystal region 13 is Al-polar. The thickness t3 of the third crystal region 13 is 10 nm. In the seventh model MD7, the first crystal region 11 is an i-AlN layer. The carrier concentration in the i-AlN layer is not more than $2 \times 10^{16}$ cm$^{-3}$. The first surface f1 of the first crystal region 11 is an N-surface. The first crystal region 11 is N-polar. The thickness t1 of the first crystal region 11 is 10 nm.

In the seventh model MD7 as shown in FIG. 8, the sharp peak pk is observed at the position corresponding to the front surface of the first crystal region 11 (the surface facing the gap 40). Because the width of the peak pk (the length along the Z-axis direction) is narrow, the electrons 51 easily tunnel through the peak pk and are emitted. In the seventh model MD7, the energy difference Eh excluding the sharp peak pk substantially relates to the ease of emitting the electrons 51. In the seventh model MD7, the energy difference Eh is 2.4 eV.

As in the seventh model MD7, a relatively small energy difference Eh is obtained for the configurations of the second, third, and first crystal regions 12, 13, and 11. The Group III (Al)-polar third crystal region 13 is provided between the second crystal region 12 and the first crystal region 11. It is easy to manufacture the Group III (Al)-polar third crystal region 13. Stable crystal quality is obtained in the third crystal region 13. By providing the N-polar first crystal region 11 on such a third crystal region 13, stable crystal quality is obtained in the first crystal region 11. Due to the stable crystal quality, the electrons 51 can be emitted with high efficiency.

Figure 9:
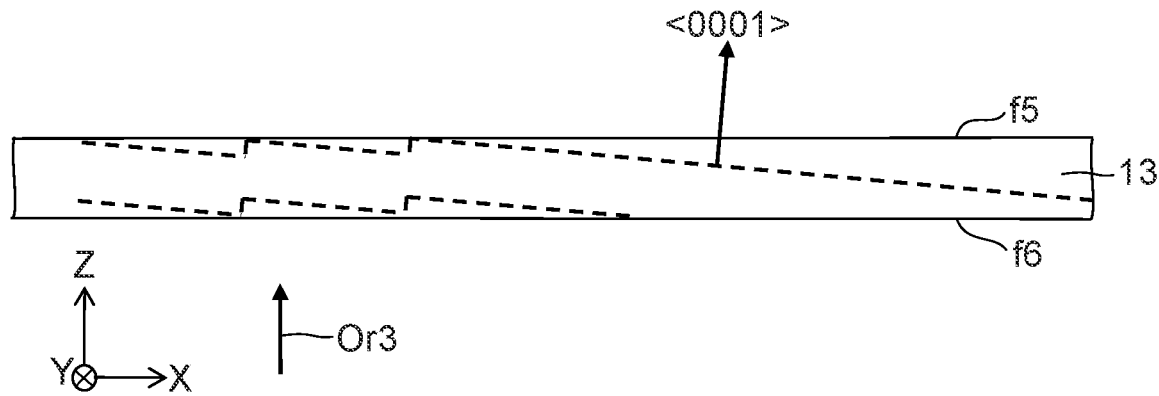
FIG. 9 is a schematic cross-sectional view illustrating the power generation element according to the first embodiment.

FIG. 9 is a schematic cross-sectional view illustrating the power generation element according to the first embodiment.

As shown in FIG. 9, the orientation Or3 from the sixth surface f6 toward the fifth surface f5 may be oblique to the <0001> direction. The angle between the orientation Or3 and the <0001> direction is, for example, not less than 0 degrees and not more than 10 degrees.

Second Embodiment

Figure 10A:
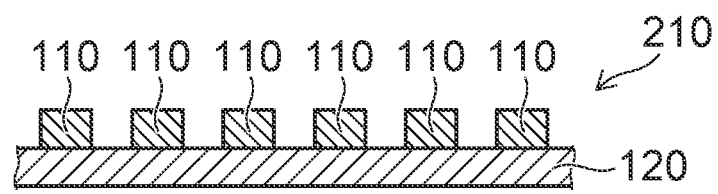
FIGS. 10A and 10B are schematic cross-sectional views showing a power generation module and a power generation device according to a second embodiment.
Figure 10B:
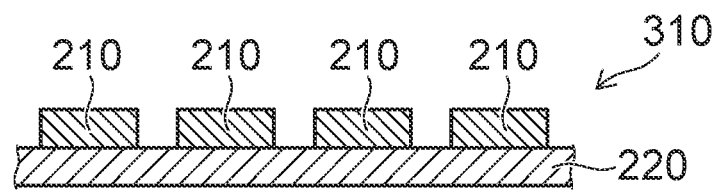

FIGS. 10A and 10B are schematic cross-sectional views showing a power generation module and a power generation device according to a second embodiment.

As shown in FIG. 10A, the power generation module 210 according to the embodiment includes the power generation element (e.g., the power generation element 110, etc.) according to the first embodiment. In the example, multiple power generation elements 110 are arranged on a substrate 120.

As shown in FIG. 10B, the power generation device 310 according to the embodiment includes the power generation module 210 described above. Multiple power generation modules 210 may be provided. In the example, the multiple power generation modules 210 are arranged on a substrate 220.

Figure 11A:
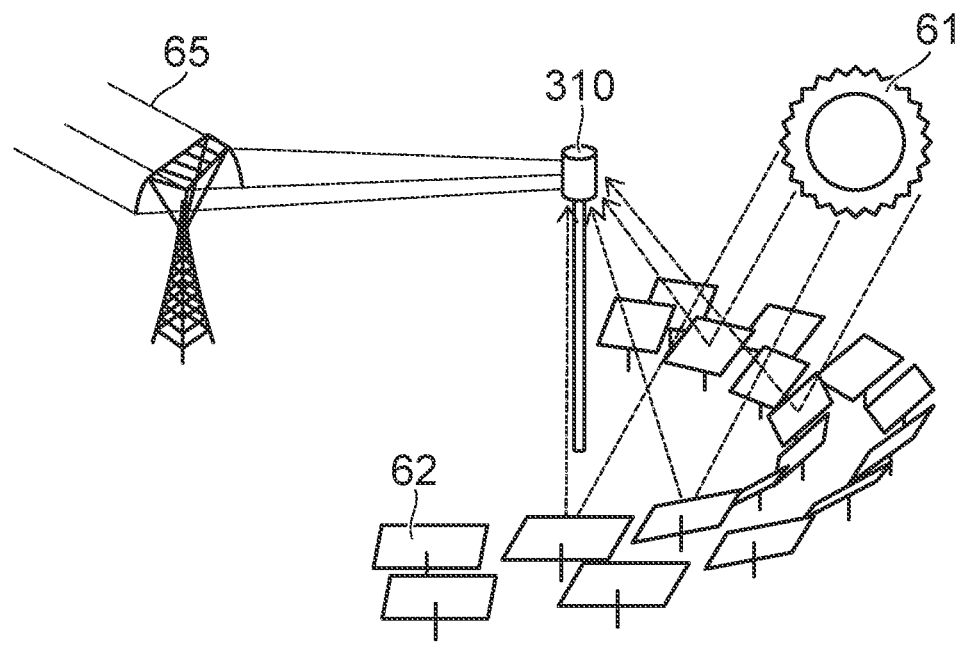
FIGS. 11A and 11B are schematic views showing the power generation device and a power generation system according to the embodiment.
Figure 11B:
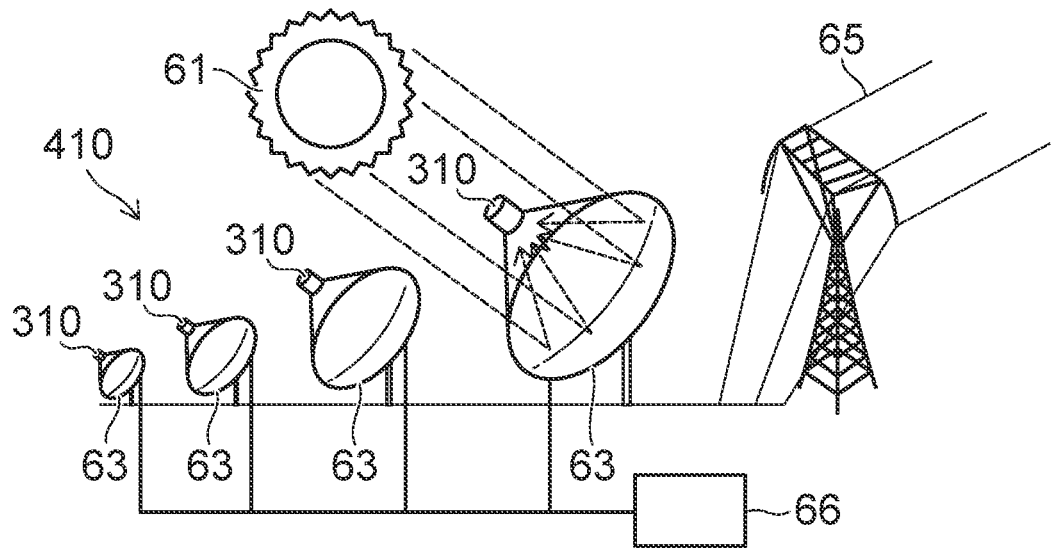

FIGS. 11A and 11B are schematic views showing the power generation device and a power generation system according to the embodiment.

As shown in FIGS. 11A and 11B, the power generation device 310 according to the embodiment (i.e., the power generation element 110, etc., according to the embodiment) is applicable to solar thermal power generation.

As shown in FIG. 11A, for example, the light from the sun 61 is reflected by a heliostat 62 and is incident on the power generation device 310 (the power generation element 110 or the power generation module 210). The light causes the first temperature T1 of the first electrode E1 to increase. The first temperature T1 becomes greater than the second temperature T2. Heat is changed into current. The current is transmitted by a power line 65, etc.

As shown in FIG. 11B, for example, the light from the sun 61 is concentrated by a concentrating mirror 63 and is incident on the power generation device 310 (the power generation element 110 or the power generation module 210). The heat due to the light is changed into current. The current is transmitted by the power line 65, etc.

For example, the power generation system 410 includes the power generation device 310. In the example, multiple power generation devices 310 are provided. In the example, the power generation system 410 includes the power generation device 310 and a drive device 66. The drive device 66 causes the power generation device 310 to follow the movement of the sun 61. By following the movement of the sun 61, efficient power generation can be performed.

Highly efficient power generation can be performed by using the power generation element (e.g., the power generation element 110, etc.) according to the embodiment.

According to the embodiments, a power generation element, a power generation module, a power generation device, and a power generation system can be provided in which the efficiency can be stably increased.

In the specification, "nitride semiconductor" includes all compositions of semiconductors of the chemical formula $B_xIn_yAl_zGa_{1-x-y-z}N$ (0≤x≤1, 0≤y≤1, 0≤z≤1, and x+y+z≤1) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as electrodes, member crystal regions, layer regions, terminals, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements, power generation modules, power generation devices, power generation systems, and methods for manufacturing power generation elements practicable by an appropriate design modification by one skilled in the art based on the power generation elements, the power generation modules, the power generation devices, the power generation systems, and the methods for manufacturing power generation elements described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
a first crystal region including $Al_{x1}Ga_{1-x1}N$ (0<x1≤1); and
a second crystal region including a first element and $Al_{x2}Ga_{1-x2}N$ (0≤x2<x1), the first element including at least one selected from the group consisting of Si, Ge, Te, and Sn,
the first crystal region including a first surface and a second surface,
the second surface being between the second crystal region and the first surface,
the second crystal region including a third surface and a fourth surface,
the third surface being between the fourth surface and the first crystal region,
an orientation from the fourth surface toward the third surface being along a <0001> direction of the second crystal region,
an orientation from the second surface toward the first surface being along a <000-1> direction of the first crystal region.

2. The power generation element according to claim 1, wherein
the third surface is a (0001) plane of the second crystal region, and
the first surface is a (000-1) plane of the first crystal region.

3. The power generation element according to claim 1, further comprising:
a counter conductive region,
the first crystal region being between the second crystal region and the counter conductive region,
a gap being provided between the first crystal region and the counter conductive region.

4. The power generation element according to claim 3, wherein
the counter conductive region includes the first element and $Al_{z1}Ga_{1-z1}N$ (0≤z1<1 and z1<x1).

5. The power generation element according to claim 4, wherein
the counter conductive region includes a first counter surface and a second counter surface,
the first counter surface is between the first crystal region and the second counter surface, and
an orientation from the second counter surface toward the first counter surface is along a <000-1> direction of the counter conductive region.

6. The power generation element according to claim 4, wherein
the first counter surface is along a (000-1) plane of the counter conductive region.

7. The power generation element according to claim 4, wherein
z1 is less than 0.75.

8. The power generation element according to claim 3, further comprising:
a first electrode; and
a second electrode,
the second crystal region being between the first electrode and the second electrode,
the first crystal region being between the second crystal region and the second electrode,
the counter conductive region being between the first crystal region and the second electrode,
the first electrode being electrically connected to the second crystal region,
the second electrode being electrically connected to the counter conductive region.

9. The power generation element according to claim 1, further comprising:
a third crystal region provided between the second crystal region and the first crystal region,
the third crystal region including $Al_{x3}Ga_{1-x3}N$ (x2<x3≤1),
the third crystal region including a fifth surface and a sixth surface,
the fifth surface being between the sixth surface and the first crystal region,
an orientation from the sixth surface toward the fifth surface being along a <0001> direction of the third crystal region.

10. The power generation element according to claim 9, wherein
x3 is not less than 0.75.

11. The power generation element according to claim 9, wherein a concentration of the first element in the third crystal region is not more than $2\times10^{18}$ cm$^{-3}$.

12. The power generation element according to claim 9, wherein
a thickness of the third crystal region is not more than 10 nm.

13. The power generation element according to claim 1, wherein
x1 is not less than 0.75.

14. The power generation element according to claim 1, wherein
x2 is less than 0.75.

15. The power generation element according to claim 1, wherein
a carrier concentration in the first crystal region is not more than $2\times10^{16}$ cm$^{-3}$.

16. The power generation element according to claim 1, wherein
a concentration of the first element in the first crystal region is not more than $2\times10^{18}$ cm$^{-3}$.

17. The power generation element according to claim 1, wherein
the first crystal region is polarized.

18. A power generation module, comprising:
a plurality of the power generation elements according to claim 1.

19. A power generation device, comprising:
a plurality of the power generation modules according to claim 18.

20. A power generation system, comprising:
the power generation device according to claim 19; and
a drive device,
the drive device causing the power generation device to follow a movement of the sun.

* * * * *